US012672397B2

(12) United States Patent
Chen

(10) Patent No.: US 12,672,397 B2
(45) Date of Patent: Jun. 30, 2026

(54) LIGHT-EMITTING DEVICES, PREPARATION METHOD THEREOF, AND DISPLAY PANELS

(71) Applicant: Shenzhen China Star Optoelectronics Semiconductor Display Technology Co., Ltd., Shenzhen (CN)

(72) Inventor: Xuebin Chen, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 291 days.

(21) Appl. No.: 18/534,916

(22) Filed: Dec. 11, 2023

(65) Prior Publication Data

US 2024/0304756 A1 Sep. 12, 2024

(30) Foreign Application Priority Data

Mar. 9, 2023 (CN) ......................... 202310256944.4

(51) Int. Cl.
*H10H 20/822* (2025.01)
*H10H 20/01* (2025.01)
(Continued)

(52) U.S. Cl.
CPC .......... *H10H 20/822* (2025.01); *H10H 20/01* (2025.01); *H10H 20/832* (2025.01); *H10K 50/12* (2023.02); *H10K 71/30* (2023.02); *H10K 71/611* (2023.02); *H10K 85/113* (2023.02); *H10H 29/142* (2025.01)

(58) Field of Classification Search
CPC .... H10H 20/822; H10H 29/142; H10K 50/12; H10K 71/30; H10K 85/113; H10K 85/1135; H10K 59/10
See application file for complete search history.

(56) References Cited

U.S. PATENT DOCUMENTS

| | | | | |
|---|---|---|---|---|
| 2017/0186970 | A1 | 6/2017 | Chen | |
| 2021/0118954 | A1* | 4/2021 | Bailly | H10K 39/30 |

FOREIGN PATENT DOCUMENTS

| | | | |
|---|---|---|---|
| CN | 105304828 | A | 2/2016 |
| CN | 114744134 | A | 7/2022 |
| CN | 115241401 | A | 10/2022 |

OTHER PUBLICATIONS

Chinese Office Action issued in corresponding Chinese Patent Application No. 202310256944.4 dated Apr. 10, 2026, pp. 1-10.

* cited by examiner

*Primary Examiner* — Julia Slutsker
(74) *Attorney, Agent, or Firm* — Wei Te Chung; PV IP PC

(57) ABSTRACT

Disclosed is a light-emitting device, a preparation method, and a display panel. The light-emitting device includes an anode layer and a cathode layer disposed opposite to each other, a light-emitting layer disposed between the anode layer and the cathode layer, and a first interface-modifying layer disposed between the light-emitting layer and the anode layer. The first interface-modifying layer includes a thiophene-based polymer and a graphyne doped in the thiophene-based polymer and includes a first sub-layer close to the light-emitting layer and a second sub-layer close to the anode layer, and a doping ratio of the graphyne in the first sub-layer is greater than a doping ratio of the graphyne in the second sub-layer.

16 Claims, 4 Drawing Sheets

(51) Int. Cl.

| | |
|---|---|
| ***H10H 20/832*** | (2025.01) |
| ***H10H 29/14*** | (2025.01) |
| ***H10K 50/12*** | (2023.01) |
| ***H10K 71/30*** | (2023.01) |
| ***H10K 71/60*** | (2023.01) |
| ***H10K 85/10*** | (2023.01) |

LIGHT-EMITTING DEVICES, PREPARATION METHOD THEREOF, AND DISPLAY PANELS

CROSS-REFERENCE TO RELATED APPLICATIONS

This application claims priority to Chinese Patent Application No. 202310256944.4, filed on Mar. 9, 2023, the contents of which are incorporated herein by reference in its entirety.

TECHNICAL FIELD

The present disclosure relates to the field of display technologies, and more particularly, to a light-emitting device, a preparation method thereof, and a display panel.

BACKGROUND

In recent years, the performance of perovskite-type light-emitting diodes (PeLEDs) with perovskite as a light-emitting material has approached the performances of mature organic light-emitting diodes (OLEDs) and quantum dot light-emitting diodes (QLEDs), through composition optimization, interface modification, carrier transport layer optimization, and structural design.

Carbon electrode materials, mainly graphene (GP) and carbon nanotubes (CNTs), have received much attention because of their potential applications in flexible devices. However, if the carbon electrode material is used as an electrode material for perovskite optoelectronic devices, the potential barrier between the carbon electrode and the perovskite light-emitting layer is generally high, so that the hole injection and transport performance is poor, resulting in low luminous efficiency.

SUMMARY

The present disclosure provides a light-emitting device having good hole injection and transport performance, and a preparation method thereof and a display panel.

In order to solve the above problems, in a first aspect, the present disclosure provides a light-emitting device, including an anode layer and a cathode layer disposed opposite to each other, a light-emitting layer disposed between the anode layer and the cathode layer, and a first interface-modifying layer disposed between the light-emitting layer and the anode layer.

The first interface-modifying layer includes a thiophene-based polymer and a graphyne doped in the thiophene-based polymer, and includes a first sub-layer disposed on the light-emitting layer and a second sub-layer disposed between the first sub-layer and the anode layer, and a doping ratio of the graphyne in the first sub-layer is greater than a doping ratio of the graphyne in the second sub-layer.

In the light-emitting device according to an embodiment of the present disclosure, the doping ratio of the graphyne in the first interface-modifying layer gradually decreases in a direction from the light-emitting layer toward the anode layer.

In the light-emitting device according to an embodiment of the present disclosure, a second interface-modifying layer is provided between the first interface-modifying layer and the light-emitting layer, and a material of the second interface-modifying layer is a graphyne.

In the light-emitting device according to an embodiment of the present disclosure, a third interface-modifying layer is provided between the first interface-modifying layer and the anode layer, and a material of the third interface-modifying layer is a thiophene-based polymer.

In the light-emitting device according to an embodiment of the present disclosure, the thiophene-based polymer includes m structural units represented by formula 1 and n structural units represented by formula 2:

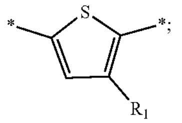

(1)

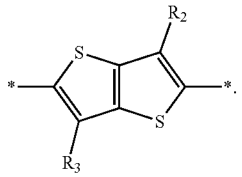

(2)

$R_1$ to $R_3$ are independently selected from an alkyl group having 1 to 10 carbon atoms, * represents a linking site, m and n are independently selected from a natural number, and at least one of m and n is not 0.

In the light-emitting device according to an embodiment of the present disclosure, $R_1$ to $R_3$ are independently selected from butyl, pentyl, or hexyl.

In the light-emitting device according to an embodiment of the present disclosure, a material of the anode layer is a carbon electrode material, and a material of the light-emitting layer is a perovskite semiconductor material.

In a second aspect, the present disclosure provides a method for preparing a light-emitting device, the method including:

S10: providing a substrate; and

S20: sequentially forming an anode layer, a first interface-modifying layer, a light-emitting layer, and a cathode layer on the substrate, or sequentially forming a cathode layer, a light-emitting layer, a first interface-modifying layer, and an anode layer on the substrate, wherein the first interface-modifying layer includes a thiophene-based polymer and a graphyne doped in the thiophene-based polymer, and includes a first sub-layer disposed on the light-emitting layer and a second sub-layer disposed between the first sub-layer and the anode layer, and a doping ratio of the graphyne in the first sub-layer is greater than a doping ratio of the graphyne in the second sub-layer.

In the method for preparing the light-emitting device according to an embodiment of the present disclosure, the step of forming the first interface-modifying layer includes:

providing an ink of the first interface-modifying layer including the thiophene-based polymer and the graphyne;

applying the ink of the first interface-modifying layer on the anode layer or the light-emitting layer to form an ink layer;

curing the ink layer to form a thiophene-based polymer-graphyne blend layer; and placing the substrate on which the thiophene-based polymer-graphyne blend layer is formed in an electric field, and converting the thiophene-based polymer-graphyne blend layer into the first interface-modifying layer under an electric field force, wherein the electric field is in a direction perpendicular to the substrate.

In a third aspect, the present disclosure provides a display panel including the light-emitting device described above.

BRIEF DESCRIPTION OF THE DRAWINGS

In order to clearly illustrate the technical solutions in the embodiments of the present invention, the accompanying drawings to be used in the description of the embodiments will be briefly introduced below. It will be apparent that the accompanying drawings in the description below are merely some of the embodiments of the present disclosure, and other drawings may be made according to these drawings for those skilled in the art without involving any inventive effort.

DETAILED DESCRIPTION

The embodiments of the present disclosure will be described in conjunction with the accompanying drawings. It is apparent that the embodiments described are only a part of the embodiments of the present disclosure, rather than all of the embodiments. All other embodiments obtained by a person skilled in the art, based on the embodiments of the present disclosure, without involving any inventive effort, are within the scope of the present disclosure.

In the description of the present disclosure, it is to be understood that the terms, such as "center", "longitudinal", "lateral", "length", "width", "thickness", "upper", "lower", "front", "rear", "left", "right", "vertical", "horizontal", "top", "bottom", "inside", "outside", indicate orientations or positional relationships based on those shown in the accompanying drawings. The terms are used to facilitate and simplify the description of the present disclosure, rather than indicate or imply that the devices or elements referred to herein are required to have specific orientations or be constructed or operate in the specific orientations. Accordingly, the terms should not be construed as limiting the present disclosure. In addition, the term "first", "second" are for illustrative purposes only and are not to be construed as indicating or imposing a relative importance or implicitly indicating the number of technical features indicated. Thus, a feature that limited by "first", "second" may expressly or implicitly include one or more features. In the description of the present disclosure, the meaning of "plural" is two or more, unless otherwise specifically defined.

In the present disclosure, the word "exemplary" is used to mean "serving as an example, illustration, or explanation". Any embodiment described as "exemplary" in the present disclosure is not necessarily construed as being more preferable or advantageous than other embodiments. In order to enable any person skilled in the art to implement and use the present disclosure, the following description is given. In the following description, the details are listed for the purpose of explanation. It should be understood that those of ordinary skill in the art can realize that the present disclosure can also be implemented without using these specific details. In other instances, well-known structures and processes will not be elaborated to avoid unnecessary details to obscure the description of the present disclosure. Therefore, the present disclosure is not intended to be limited to the illustrated embodiments, but is consistent with the widest scope that conforms to the principles and features disclosed in the present disclosure.

An embodiment of the present disclosure provides a light-emitting device, which is described in detail below with reference to the accompanying drawings.

Figure 1:
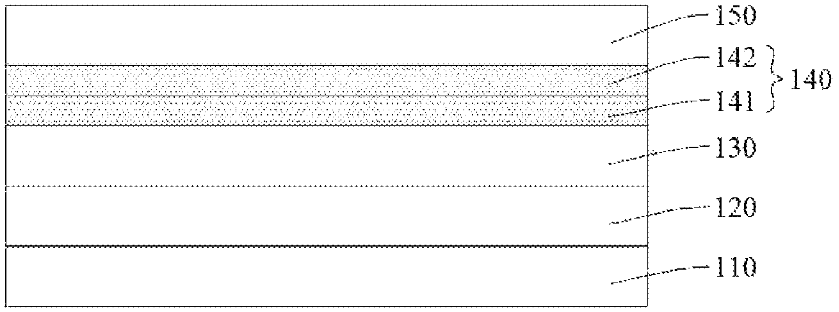
FIG. 1 is a schematic cross-sectional view of a first light-emitting device according to some embodiments of the present disclosure.

Referring to FIG. 1, the light-emitting device includes an anode layer 150 and a cathode layer 110 disposed opposite to each other, and a light-emitting layer 130 disposed between the anode layer 150 and the cathode layer 110. A first interface-modifying layer 140 is disposed between the light-emitting layer 130 and the anode layer 150.

The first interface-modifying layer 140 comprises a thiophene-based polymer and a graphyne doped in the thiophene-based polymer. The first interface-modifying layer 140 includes a first sub-layer 141 disposed on the light-emitting layer 130 and a second sub-layer 142 disposed between the first sub-layer 141 and the anode layer 150. A doping ratio of the graphyne in the first sub-layer 141 is greater than that in the second sub-layer 142.

According to the light-emitting device in the embodiments of the present disclosure, the first interface-modifying layer 140 is disposed between the anode layer 150 and the light-emitting layer 130, so as to solve the problem of excessive hole injection barrier between the anode layer 150 and the light-emitting layer 130, thereby improving the hole injection and transport performance.

In some embodiments, the thiophene-based polymer doped with the graphyne is used as a material of the first interface-modifying layer 140. After the graphyne is doped with the graphyne, π-π interaction may occur between the thiophene-based polymer and the graphyne, so that the highest occupied molecular orbital energy level of the thiophene-based polymer is decreased, and the higher the doping ratio of the graphyne, the lower the highest occupied molecular orbital energy level of the thiophene-based polymer is. In some embodiments, the first interface-modifying layer 140 includes the first sub-layer 141 disposed on the light-emitting layer 130 and the second sub-layer 142 disposed between the first sub-layer 141 and the anode layer 150, and the doping ratio of the graphyne in the first sub-layer 141 is greater than that in the second sub-layer 142, so that the highest occupied molecular orbital energy level of the thiophene-based polymer in the first sub-layer 141 is lower than that in the second sub-layer 142. In this manner, it is advantageous to reduce the barrier for hole injection from the anode layer 150 to the second sub-layer 142 and the barrier for hole transport from the first sub-layer 141 to the light-emitting layer 130, thereby improving the hole injection and transport performance of the light-emitting device, advantageously avoiding fluorescence quenching, and improving the luminous efficiency of the light-emitting device.

Illustratively, in a specific embodiment, the barrier for hole injection of from the anode layer 150 into the light-emitting layer 130 is 1 eV. The doping ratios of the graphyne in the first sub-layer 141 and the second sub-layer 142 can be respectively adjust so that the barrier for hole transport from the first sub-layer 141 to the light-emitting layer 130 is 0.4 eV, the barrier for hole injection from the anode layer 150 to the second sub-layer 142 is 0.4 eV, and the barrier for hole transport from the second sub-layer 142 to the first sub-layer 141 is 0.2 eV, thereby reducing the hole injection barrier between adjacent layers, and effectively improving the hole injection and transport performance of light-emitting device.

It is to be noted that the thiophene-based polymer in the embodiments of the present disclosure is a conductive polymer, which is a hole transport material commonly used in the art. The thiophene-based polymer may be polythiophene or a conventional derivative thereof, for example, poly(3,4-ethylenedioxythiophene), which is not particularly limited in the embodiments of the present disclosure.

Figure 2:
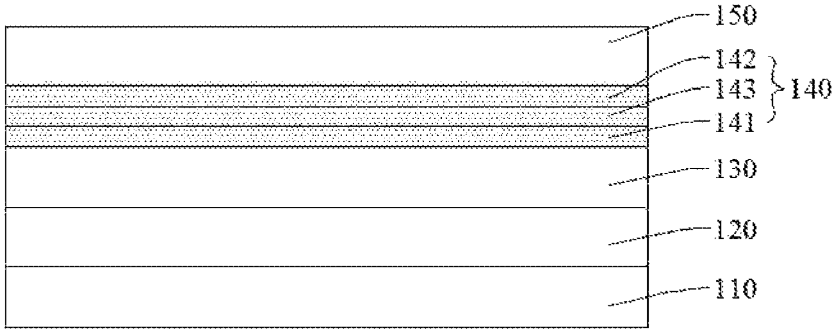
FIG. 2 is a schematic cross-sectional view of a second light-emitting device according to some embodiments of the present disclosure.

In some embodiments, the first interface-modifying layer 140 may be divided into more than two sub-layers. For example, referring to FIG. 2, the first interface-modifying layer 140 includes a first sub-layer 141 disposed on the light-emitting layer 130, a third sub-layer 143 disposed on a side of the first sub-layer away from the light-emitting layer, and a second sub-layer 142 disposed between the third sub-layer 143 and the anode layer 150. A doping ratio of the graphyne in the first sub-layer 141 is greater than that in the third sub-layer 143, and the doping ratio of the graphyne in the third sub-layer 143 is greater than that in the second sub-layer 142, so that the highest occupied molecular orbital energy level of the first sub-layer 141 is lower than that of the third sub-layer 143, and the highest occupied molecular orbital energy level of the third sub-layer 143 is lower than that of the second sub-layer 142. In this manner, it is advantageous to reduce the hole injection barrier between the anode layer 150 and the second sub-layer 142 and the hole injection barrier between the first sub-layer 141 and the light-emitting layer 130, thereby improving the hole injection and transport performance on the anode 150 side, advantageously avoiding fluorescence quenching, and improving the luminous efficiency of the light-emitting device.

Illustratively, in a specific embodiment, the barrier for hole injection from the anode layer 150 into the light-emitting layer 130 is 1 eV. By adjusting the doping ratios of the graphyne in the first sub-layer 141, the second sub-layer 142, and the third sub-layer 143, respectively, the barrier for hole transport from the first sub-layer 141 to the light-emitting layer 130 is 0.3 eV, the barrier for hole injection from the anode layer 150 to the second sub-layer 142 is 0.3 eV, the barrier for hole transport from the third sub-layer 143 to the first sub-layer 141 is 0.2 eV, and the barrier for hole transport from the second sub-layer 142 to the third sub-layer 143 is 0.2 eV, thus reducing the hole injection barrier between adjacent layers, and effectively improving the hole injection and transport performance of the light-emitting device.

It is to be understood that theoretically, the greater the number of sub-layers of the first interface-modifying layer 140, the better the improvement of hole injection and transport performance. The specific number of sub-layers of the first interface-modifying layer 140 may be set according to actual process requirements.

Figure 3:
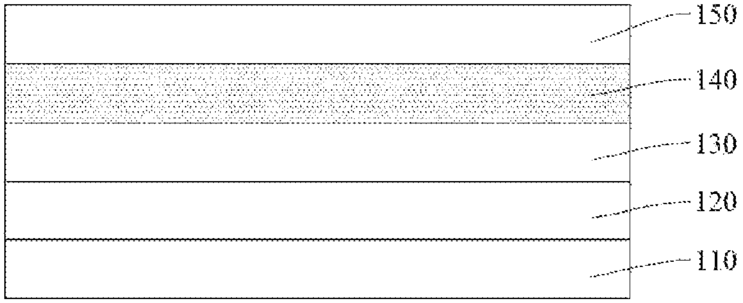
FIG. 3 is a schematic cross-sectional view of a third light-emitting device according to some embodiments of the present disclosure.

In some embodiments, referring to FIG. 3, the doping ratios of the graphyne in the first interface-modifying layer 140 gradually decrease in a direction from the light-emitting layer 130 toward the anode layer 150, meaning that the first interface-modifying layer 140 is divided into a plurality of stacked sub-layers (not shown), and the doping ratios of the graphyne in the sub-layers gradually decrease in the direction from the light-emitting layer 130 toward the anode layer 150. In the present embodiment, the doping ratios of the graphyne decrease gradually in the direction from the light-emitting layer 130 toward the anode layer 150, so that the barrier for hole injection from the anode layer 150 to the first interface-modifying layer 140 and the barrier for hole transport from the first interface-modifying layer 140 to the light-emitting layer 130 can be reduced, and the highest occupied molecular orbital energy level inside the first interface-modifying layer 140 gradually decrease from a side close to the anode layer 150 to a side close to the light-emitting layer 130. This advantageously improves the hole injection and transport performance on the anode 150 side, avoids fluorescence quenching, and improves the luminous efficiency of the light-emitting device.

Figure 4:
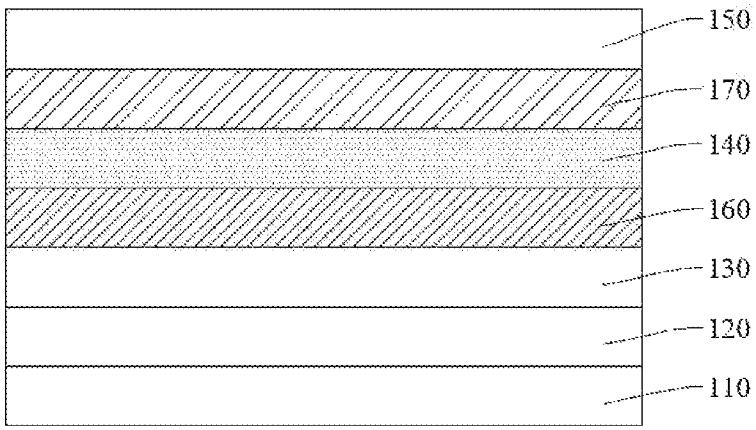
FIG. 4 is a schematic cross-sectional view of a fourth light-emitting device according to some embodiments of the present disclosure.

In some embodiments, referring to FIG. 4, a second interface-modifying layer 160 is provided between the first interface-modifying layer 140 and the light-emitting layer 130. The second interface-modifying layer 160 may be made of the graphyne. The second interface-modifying layer 160 made from the graphyne can alleviate a surface defect of the light-emitting layer 130, and match energy levels of the first interface-modifying layer 140 and the light-emitting layer 130, thereby enhancing the hole transport performance and the luminous efficiency of the light-emitting device.

In some embodiments, referring to FIG. 4, a third interface-modifying layer 170 is provided between the first interface-modifying layer 140 and the anode layer 150. The third interface-modifying layer 170 is made of a thiophene-based polymer. The third interface-modifying layer 170 made from the thiophene-based polymer can improve the performance of the anode layer 150, particularly when the anode layer 150 is made of carbon nanotubes, can effectively improve the stacking property of the carbon nanotubes, so that the carbon nanotubes have a stronger T-T interaction. In addition, the third interface-modifying layer 170 can further match the energy levels of the first interface-modifying layer 140 and the anode layer 150, so as to improve the hole injection performance and thus the luminous efficiency of the light-emitting device.

In some embodiments, thicknesses of the first interface-modifying layer 140, the second interface-modifying layer 160, and the third interface-modifying layer 170 are not particularly limited, which may be synergistically adjusted so as to optimize the performance of the light-emitting device.

In some embodiments, the thiophene-based polymer comprises m structural units represented by formula 1 and n structural units represented by formula 2:

(1)

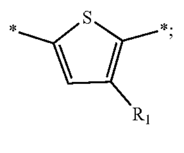

-continued (2)

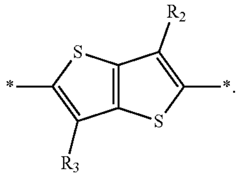

$R_1$ to $R_3$ are independently selected from an alkyl group having 1 to 10 carbon atoms, * represents a linking site, m and n are independently selected from natural numbers, and at least one of m and n is not 0.

When n is 0, the thiophene-based polymer is composed of only structural units represented by formula 1. Specifically, the thiophene-based polymer is represented by the following structural formula:

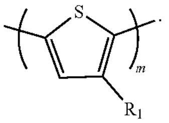

When m is 0, the thiophene-based polymer is composed only of structural units represented by formula 2. Specifically, the thiophene-based polymer is represented by the following structural formula:

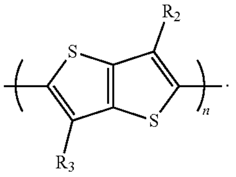

When neither m nor n is 0, the thiophene-based polymer is a copolymer containing structural units represented by formula 1 and structural units represented by formula 2.

In some embodiments, the thiophene-based polymer is an A-B block interpolymer, which comprises structural units represented by formula 1 to create a block A and structural units represented by formula 2 to create a block B. Specifically, the thiophene-based polymer is represented by the following structural formula:

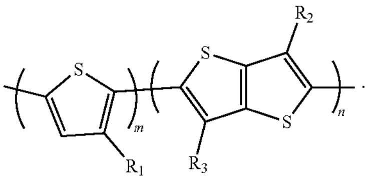

In another embodiment, the thiophene-based polymer is an alternating copolymer, which is formed by alternating and connecting structural units represented by formula 1 and structural units represented by formula 2. Specifically, the thiophene-based polymer is represented by the following structural formula:

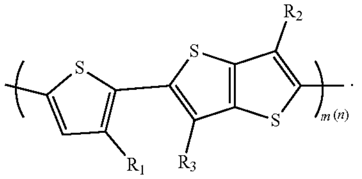

In another embodiment, the thiophene-based polymer is a random copolymer, which is formed by randomly connecting structural units represented by formula 1 and structural units represented by formula 2.

In some embodiments, both of m and n are not 0. In this way, the ratios of the structural units represented by formula 1 and the structural units represented by formula 2 can be adjusted so that the physical and chemical properties of the thiophene-based polymer such as the molecular orbital energy level, viscosity, and refractive index can be adjusted to match the process requirements of the light-emitting device.

In some embodiments, $R_1$ to $R_3$ are independently selected from of butyl, pentyl, or hexyl. $R_1$ to $R_3$ are the same or different from each other. By setting appropriate $R_1$ to $R_3$, the fine tuning of the physical and chemical properties of the thiophene-based polymer, such as molecular orbital energy levels, viscosity, refractive index, can be accomplished to further match the process requirements of the light-emitting device.

In some embodiments, the graphyne is α-graphyne or γ-graphyne.

In some embodiments, the graphyne is a doped or undoped graphyne.

In some embodiments, the anode layer 150 is made of a carbon electrode material, and the light-emitting layer 130 is made of a perovskite semiconductor material.

In some embodiments, the perovskite semiconductor material is selected from a doped or undoped inorganic perovskite semiconductor, or an organic-inorganic hybrid perovskite semiconductor. The inorganic perovskite semiconductor has a general formula $AMX_3$, in which A is an Cs+ ion, M is a divalent metal cation selected from at least one of $Pb^{2+}$, $Sn^{2+}$, $Cu^{2+}$, $Ni^{2+}$, $Cd^{2+}$, $Cr^{2+}$, $Mn^{2+}$, $Co^{2+}$, $Fe^{2+}$, $Ge^{2+}$, $Yb^{2+}$, or $Eu^{2+}$, and X is a halogen anion selected from at least one of $Cl^-$, $Br^-$, or $I^-$. The organic-inorganic hybrid perovskite semiconductor has a general formula $BMX_3$, in which B is an organic amine cation selected from CH3 $(CH2)_{x-2}NH_3^+$ or $[NH_3(CH2)_xNH_3]^{2+}$, x≥2, M is a divalent metal cation selected from at least one of $Pb^{2+}$, $Sn^{2+}$, $Cu^{2+}$, $Ni^{2+}$, $Cd^{2+}$, $Cr^{2+}$, $Mn^{2+}$, $Co^{2+}$, $Fe^{2+}$, $Ge^{2+}$, $Yb^{2+}$, or $Eu^{2+}$, and X is a halogen anion selected from at least one of $Cl^-$, $Br^-$ or $I^-$.

The carbon electrode material is selected from carbon nanotubes, graphite, carbon black, carbon sponge, graphene, carbon fibers, or activated carbon fibers.

In some embodiments, a material of the cathode layer 110 is a transparent electrode, so that light from the light-emitting device can exit from the cathode layer 110. Specifically, the material of the cathode layer 110 is selected from indium tin oxide and indium zinc oxide. The thickness of the cathode layer 110 is 10 to 50 nm.

In some embodiments, the light-emitting device further includes an electron injection layer 120 disposed between the cathode layer 110 and the light-emitting layer. A material of the electron injection layer 120 may be selected from an inorganic material having a lower vacuum energy level, an organic material having a lower lowest unoccupied molecular orbital energy level, or an organic doping material. Specifically, the material of the electron injection layer 120 is selected from ZnO, LiF, Liq, $CaF_2$, MgF, NaF, KF, $BaF_2$, CsF, CsOH, $Cs_2CO_3$, ZnMgO, alkali metal oxides, alkaline earth metal oxides, alkali metal carbonates, alkaline earth metal carbonates, alkali metal fluorides, alkaline earth metal fluorides, alkaline earth metal hydroxides, or alkali metal hydroxides.

Figure 5:
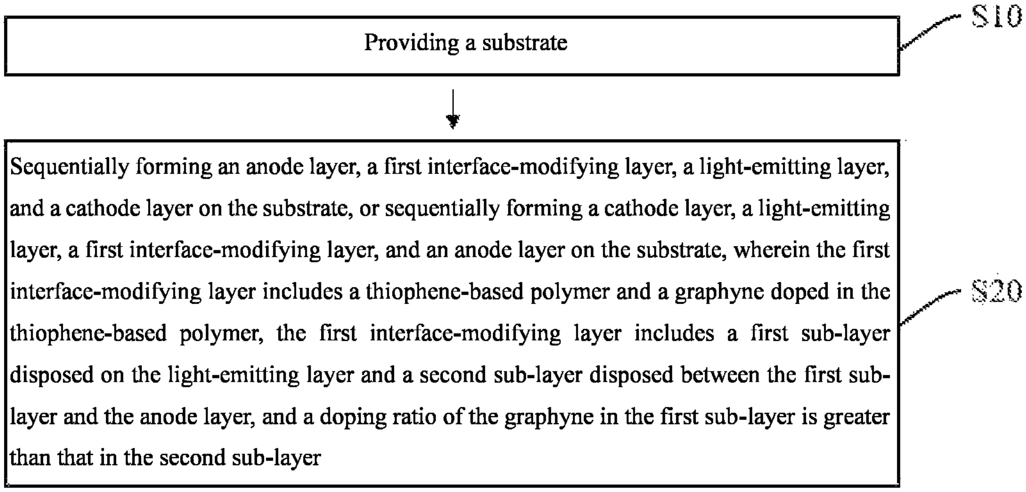
FIG. 5 is a schematic flowchart of a method for preparing a light-emitting device according to some embodiments of the present disclosure.

Another embodiment of the present disclosure provides a method for preparing a light-emitting device. Referring to FIG. 5, the method includes the steps of:

S10: providing a substrate; and

S20: sequentially forming an anode layer, a first interface-modifying layer, a light-emitting layer, and a cathode layer on the substrate, or sequentially forming a cathode layer, a light-emitting layer, a first interface-modifying layer, and an anode layer on the substrate. The first interface-modifying layer comprises a thiophene-based polymer and a graphyne doped in the thiophene-based polymer. The first interface-modifying layer includes a first sub-layer disposed on the light-emitting layer and a second sub-layer disposed between the first sub-layer and the anode layer. A doping ratio of the graphyne in the first sub-layer is greater than that in the second sub-layer.

It is to be noted that, the substrate serves as a support structure for the light-emitting device, and the layers, in an order from the anode layer to the cathode layer, specifically an anode layer, a first interface-modifying layer, a light-emitting layer, and a cathode layer, or in an order from the cathode layer to the anode layer, specifically a cathode layer, a light-emitting layer, a first interface-modifying layer, and an anode layer, may be formed on the substrate in sequence.

In some embodiments, the cathode layer may be formed by sputtering coating and photoetching and patterning processes. The light-emitting layer, the first interface-modifying layer, and the anode layer may be respectively formed by a solution processing process that is selected from an ink jet printing or a spin coating.

In some embodiments, the step of forming the first interface-modifying layer includes:

providing an ink of the interface-modifying layer, the ink comprising a thiophene-based polymer and a graphyne;

forming an ink layer on the anode layer or the light-emitting layer using the ink of the interface-modifying layer;

curing the ink layer to form a thiophene-based polymer-graphyne blend layer; and placing the substrate on which the thiophene-based polymer-graphyne blend layer is formed in an electric field to convert the thiophene-based polymer-graphyne blend layer into the first interface-modifying layer under the action of electric field forces, the electric field being in a direction perpendicular to the substrate.

The electric field treatment is a key step for obtaining the first interface-modifying layer, the principle of which is illustrated as follows:

before the electric field treatment is carried out, graphyne in the thiophene-based polymer-graphyne blend layer is in a uniformly doped state, and since electron transfer may occur between the thiophene-based polymer and the graphyne, one of the thiophene-based polymer and the graphyne is positively charged and the other is negatively charged. After the substrate is placed in a vertical electric field, the thiophene-based polymer and the graphyne may move in the opposite direction under the action of the electric field force, so that the doping concentration of the graphyne on a side of the formed first interface-modifying layer is higher than that on the other side of the formed first interface-modifying layer.

The direction of the electric field may be adjusted according to the actual charging condition of the thiophene-based polymer and the graphyne. If the graphyne is positively charged, the direction of the electric field is from the thiophene-based polymer-graphyne blend layer to the substrate. If the graphyne is negatively charged, the direction of the electric field is from the substrate to the thiophene-based polymer-graphyne blend layer.

It is to be noted that the electron transfer direction between the thiophene-based polymer and the graphyne is depended on the doped state of graphyne.

In some embodiments, the step of providing the ink of the interface-modifying layer includes blending the thiophene-based polymer with the graphyne, and then adding them to an organic solvent, and sufficiently dispersing and homogenizing by ultrasonic dispersion or stirring to obtain the ink of the interface-modifying layer.

A method for preparing a light-emitting device according to an embodiment of the present disclosure is described in detail below in conjunction with FIGS. 6A to 6F.

Figure 6A:
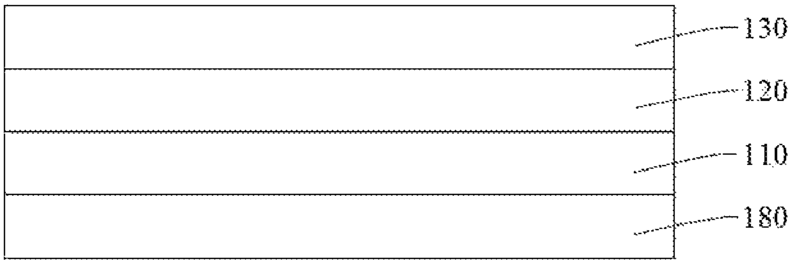
FIGS. 6A to 6F show a schematic flowchart of a method for preparing a light-emitting device according to some embodiments of the present disclosure.

Referring to FIG. 6A, a substrate 180 is provided, and a cathode layer 110 is formed on the substrate 180 by a magnetron sputtering and a photoetching and patterning process. Then, an electron injection layer 120 and a light-emitting layer 130 are sequentially formed on the cathode layer 110 by an ink-jet printing process.

Figure 6B:
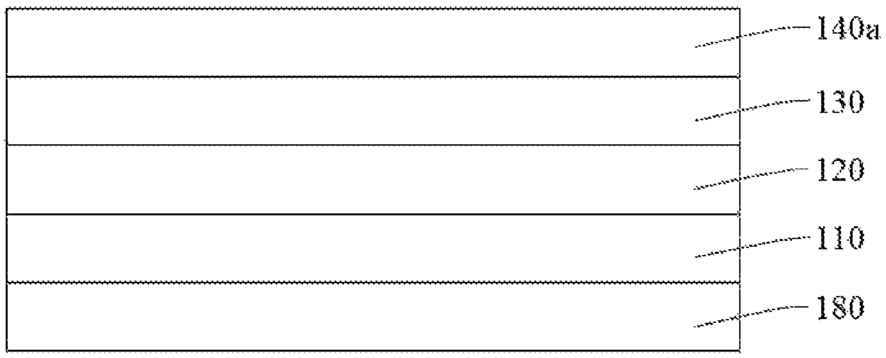

Referring to FIG. 6B, a thiophene-based polymer and a graphyne powder are blended and then added to a dichlorobenzene solvent, and the mixture is dispersed sufficiently and uniformly by means of ultrasound and stirring to obtain an ink of an interface-modifying layer. The ink of the interface-modifying layer is applied on the light-emitting layer 130 by an ink-jet printing process to form an ink layer 140*a*.

Figure 6C:
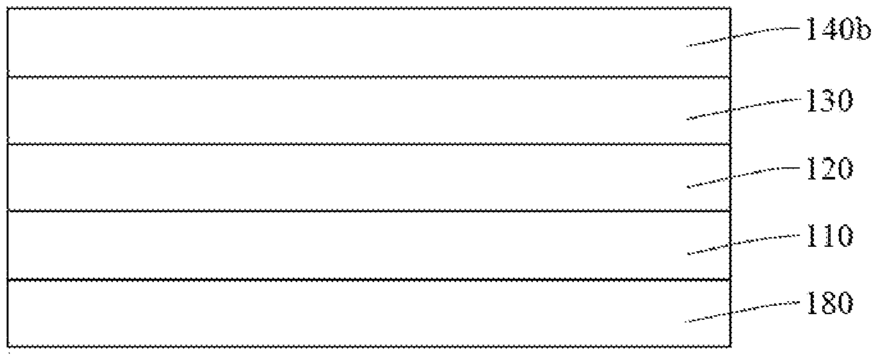

Referring to FIG. 6C, the ink layer 140*a* is cured, and the organic solvent dichlorobenzene existing in the ink layer 140*a* is removed to obtain the thiophene-based polymer-graphyne blend layer 140*b*.

Figure 6D:
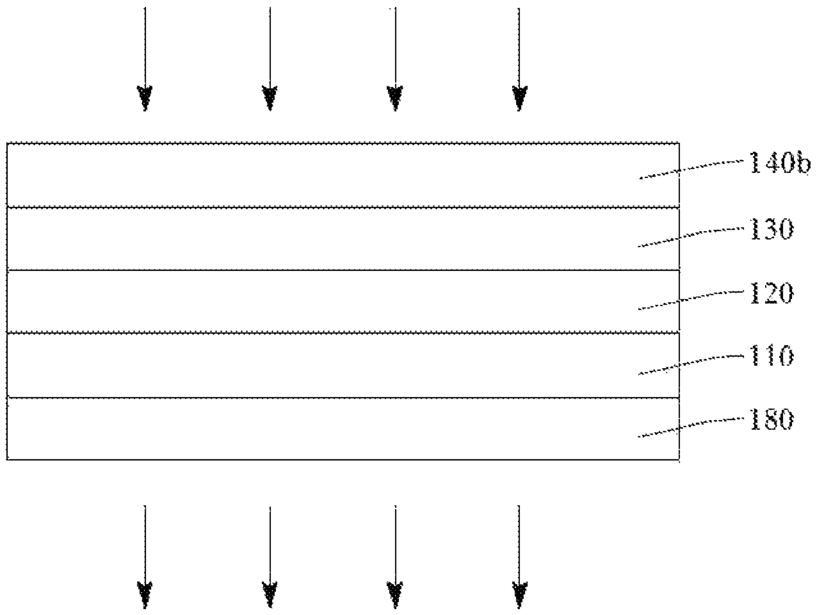

Referring to FIG. 6D, the substrate 180 on which the thiophene-based polymer-graphyne blend layer 140*b* is formed is placed in an electric field whose direction is perpendicular to the substrate 180.

Figure 6E:
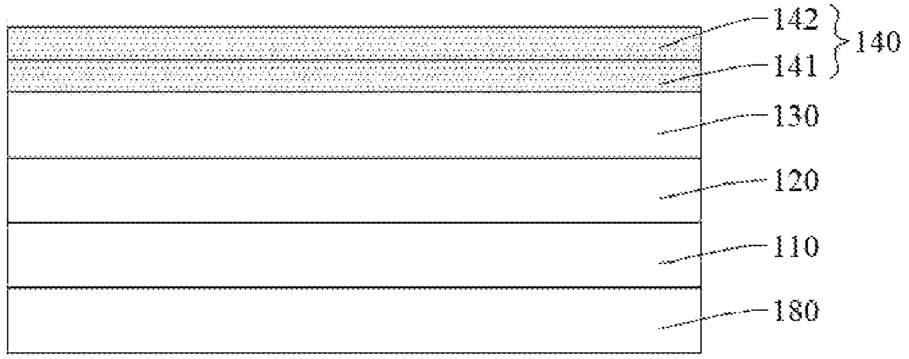

Referring to FIG. 6E, the thiophene-based polymer-graphyne blend layer 140*b* is converted to the first interface-modifying layer 140 under the action of an electric field force, and the electric field is removed.

Figure 6F:
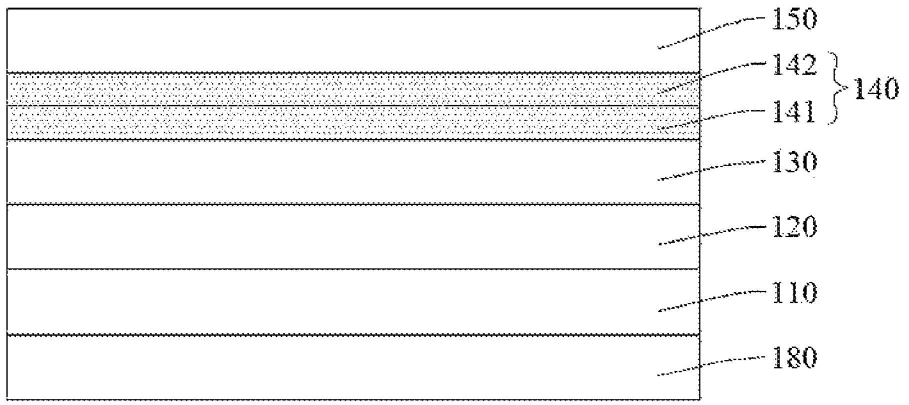

Referring to FIG. 6F, the anode layer 150 is formed on the first interface-modifying layer 140 by an ink jet printing process to complete the preparation of the light-emitting device.

Still another embodiment of the present disclosure provides a display panel including the light-emitting device according to the foregoing embodiments, as further described below in connection with the accompanying drawings.

Figure 7:
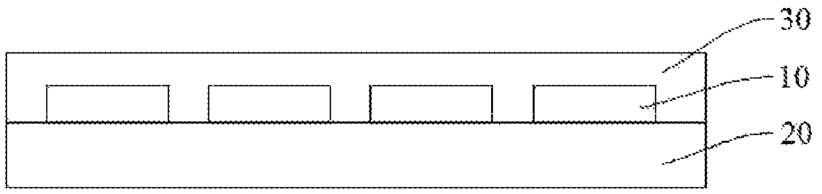
FIG. 7 is a schematic cross-sectional view of a display panel according to some embodiments of the present disclosure.

Referring to FIG. 7, the display panel includes a drive substrate 20, a plurality of the light-emitting device 10 disposed on the drive substrate 20, and an encapsulation layer 30 for encapsulating the drive substrate 20 and the light-emitting devices 10.

The drive substrate 20 is generally an array substrate, which includes a base substrate and a thin film transistor layer disposed on the base substrate. The thin film transistor layer includes a plurality of thin film transistor devices. One of the light-emitting devices 10 is electrically connected to a corresponding one of the thin film transistor devices, thereby realizing driving display.

Another embodiment of the present disclosure further provides a display apparatus including the display panel according to the above embodiments. The display apparatus includes, but not limited to, a mobile phone, a smart watch, a tablet computer, a laptop, a television, and other apparatuses.

The foregoing describes in detail a light-emitting device and a preparation method thereof and a display panel according to the embodiments of the present disclosure. The principles and implementations of the present disclosure are described herein using specific embodiments. The description of the above embodiments is merely provided to assist in understanding the present disclosure and its core concepts. In addition, variation in the detailed description and scope of application may be made to those skilled in the art in accordance with the teachings of the present disclosure. In light of the foregoing, the present specification is not to be construed as limiting the present disclosure.

What is claimed is:

1. A light-emitting device comprising an anode layer and a cathode layer disposed opposite to each other, a light-emitting layer disposed between the anode layer and the cathode layer, and a first interface-modifying layer disposed between the light-emitting layer and the anode layer, wherein the first interface-modifying layer comprises a thiophene-based polymer and a graphyne doped in the thiophene-based polymer, and the first interface-modifying layer comprises a first sub-layer disposed on the light-emitting layer and a second sub-layer disposed between the first sub-layer and the anode layer, and a doping ratio of the graphyne in the first sub-layer is greater than a doping ratio of the graphyne in the second sub-layer.

2. The light-emitting device according to claim 1, wherein the doping ratio of the graphyne in the first interface-modifying layer gradually decreases in a direction from the light-emitting layer toward the anode layer.

3. The light-emitting device according to claim 1, wherein a second interface-modifying layer is provided between the first interface-modifying layer and the light-emitting layer, and a material of the second interface-modifying layer is a graphyne.

4. The light-emitting device according to claim 1, wherein a third interface-modifying layer is provided between the first interface-modifying layer and the anode layer, and a material of the third interface-modifying layer is a thiophene-based polymer.

5. The light-emitting device according to claim 1, wherein the thiophene-based polymer comprises m structural units represented by formula 1 and n structural units represented by formula 2:

(1)

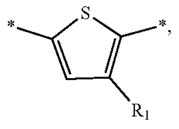

-continued (2)

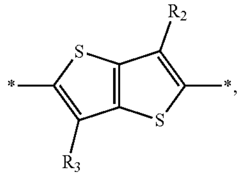

wherein $R_1$ to $R_3$ are independently selected from an alkyl group having 1 to 10 carbon atoms, * represents a linking site, m and n are independently selected from a natural number, and at least one of m and n is not 0.

6. The light-emitting device according to claim 5, wherein $R_1$ to $R_3$ are independently selected from butyl, pentyl, or hexyl.

7. The light-emitting device according to claim 1, wherein a material of the anode layer is a carbon electrode material, and a material of the light-emitting layer is a perovskite semiconductor material.

8. A method for preparing a light-emitting device, comprising:

S10: providing a substrate; and

S20: sequentially forming an anode layer, a first interface-modifying layer, a light-emitting layer, and a cathode layer on the substrate, or sequentially forming a cathode layer, a light-emitting layer, a first interface-modifying layer, and an anode layer on the substrate, wherein the first interface-modifying layer comprises a thiophene-based polymer and a graphyne doped in the thiophene-based polymer, and the first interface-modifying layer comprises a first sub-layer disposed on the light-emitting layer and a second sub-layer disposed between the first sub-layer and the anode layer, and a doping ratio of the graphyne in the first sub-layer is greater than a doping ratio of the graphyne in the second sub-layer.

9. The method according to claim 8, wherein the step of forming the first interface-modifying layer comprises:

providing an ink of the first interface-modifying layer comprising the thiophene-based polymer and the graphyne;

applying the ink of the first interface-modifying layer on the anode layer or the light-emitting layer to form an ink layer;

curing the ink layer to form a thiophene-based polymer-graphyne blend layer; and placing the substrate on which the thiophene-based polymer-graphyne blend layer is formed in an electric field, and converting the thiophene-based polymer-graphyne blend layer into the first interface-modifying layer under an electric field force, wherein the electric field is in a direction perpendicular to the substrate.

10. A display panel comprising a light-emitting device, wherein the light-emitting device comprises an anode layer and a cathode layer disposed opposite to each other, a light-emitting layer disposed between the anode layer and the cathode layer, and a first interface-modifying layer disposed between the light-emitting layer and the anode layer, and the first interface-modifying layer comprises a thiophene-based polymer and a graphyne doped in the thiophene-based polymer, and the first interface-modifying layer comprises a first sub-layer disposed on the light-emitting layer and a second sub-layer disposed between the first sub-layer and the anode layer, and a doping ratio of the graphyne in the first sub-layer is greater than a doping ratio of the graphyne in the second sub-layer.

11. The display panel according to claim 10, wherein the doping ratio of the graphyne in the first interface-modifying layer gradually decreases in a direction from the light-emitting layer toward the anode layer.

12. The display panel according to claim 10, wherein a second interface-modifying layer is provided between the first interface-modifying layer and the light-emitting layer, and a material of the second interface-modifying layer is a graphyne.

13. The display panel according to claim 10, wherein a third interface-modifying layer is provided between the first interface-modifying layer and the anode layer, and a material of the third interface-modifying layer is a thiophene-based polymer.

14. The display panel according to claim 10, wherein the thiophene-based polymer comprises m structural units represented by formula 1 and n structural units represented by formula 2:

(1)

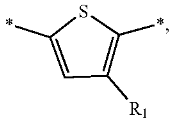

-continued (2)

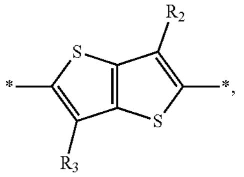

wherein $R_1$ to $R_3$ are independently selected from an alkyl group having 1 to 10 carbon atoms, * represents a linking site, m and n are independently selected from a natural number, and at least one of m and n is not 0.

15. The display panel according to claim 14, wherein $R_1$ to $R_3$ are independently selected from butyl, pentyl, or hexyl.

16. The display panel according to claim 10, wherein a material of the anode layer is a carbon electrode material, and a material of the light-emitting layer is a perovskite semiconductor material.

* * * * *